United States Patent
Endo

(10) Patent No.: US 10,250,268 B2
(45) Date of Patent: Apr. 2, 2019

(54) PLL CIRCUIT

(71) Applicant: NIHON DEMPA KOGYO CO., LTD., Tokyo (JP)

(72) Inventor: Takeshi Endo, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/028,388

(22) Filed: Jul. 5, 2018

(65) Prior Publication Data

US 2019/0020348 A1   Jan. 17, 2019

(30) Foreign Application Priority Data

Jul. 11, 2017   (JP) .................................. 2017-135188

(51) Int. Cl.
*H03L 7/087* (2006.01)
*H03L 7/099* (2006.01)

(52) U.S. Cl.
CPC .............. *H03L 7/087* (2013.01); *H03L 7/099* (2013.01)

(58) Field of Classification Search
CPC ............................... H03L 7/087; H03L 7/099
USPC .................................. 327/147, 150, 156, 159
See application file for complete search history.

(56) References Cited

U.S. PATENT DOCUMENTS

| | | | | |
|---|---|---|---|---|
| 5,278,874 A | * | 1/1994 | Liu | H03L 7/113 331/11 |
| 5,506,875 A | * | 4/1996 | Nuckolls | H03L 7/0991 327/150 |
| 7,944,256 B2 | * | 5/2011 | Masuda | H03D 13/004 327/147 |
| 2003/0001679 A1 | * | 1/2003 | Lever | G11C 7/22 331/11 |
| 2005/0200391 A1 | * | 9/2005 | Steinbach | H03L 7/087 327/156 |
| 2014/0306741 A1 | * | 10/2014 | Grabinski | H03L 7/087 327/157 |

FOREIGN PATENT DOCUMENTS

JP   2005347817   12/2005

* cited by examiner

*Primary Examiner* — William Hernandez
(74) *Attorney, Agent, or Firm* — JCIPRNET

(57) ABSTRACT

A PLL circuit includes a voltage control oscillator, a frequency difference detector, a phase difference detector, and an outputter. The frequency difference detector detects a frequency difference between a reference signal and the oscillation signal and outputs a first control value based on the detected frequency difference. The phase difference detector detects a phase difference between the reference signal and the oscillation signal, and outputs a second control value based on the detected phase difference. The outputter outputs the control voltage based on the first control value and the second control value to the voltage control oscillator while the second control value does not exceed a predetermined range, and outputs the control voltage based on a corrected value obtained by correcting the first control value and the second control value to the voltage control oscillator while the second control value exceeds a predetermined range.

5 Claims, 2 Drawing Sheets

PLL CIRCUIT

CROSS-REFERENCE TO RELATED APPLICATIONS

This application is based on and claims priority under 35 U.S.C. § 119 to Japanese Patent Application No. 2017-135188, filed on Jul. 11, 2017, the entire content of which is incorporated herein by reference.

TECHNICAL FIELD

The disclosure relates to a Phase Locked Loop (PLL) circuit.

DESCRIPTION OF THE RELATED ART

In a Phase Locked Loop (PLL) circuit, a phase difference signal output by a phase comparator corresponding to a phase difference between an oscillation signal output from a voltage control oscillator and a reference signal input from an outside is converted into a control signal that controls a frequency of the oscillation signal, and this control signal is input to the voltage control oscillator. The voltage control oscillator outputs an oscillation signal of a frequency corresponding to a voltage of the input control signal (for example, see Japanese Unexamined Patent Application Publication No. 2005-347817).

There has been a case where a PLL circuit transitions from a lock-up state, which is a state where the phase difference between the oscillation signal and the reference signal is constant, to an unlock state where this phase difference is shifted, due to a factor inside the PLL circuit, such as temperature characteristics of the voltage control oscillator, and a factor outside the PLL circuit, such as a power source noise occurrence. In this case, it is not possible for the PLL circuit to transition to the lock-up state until the factor causing the unlock state is removed. Accordingly, the conventional PLL circuit has a problem that it takes a time in transitioning from the unlock state to the lock-up state.

A need thus exists for a PLL circuit which is not susceptible to the drawback mentioned above.

SUMMARY

According to a first aspect of this disclosure, there is provided a PLL circuit that includes a voltage control oscillator, a frequency difference detector, a phase difference detector, and an outputter. The voltage control oscillator outputs an oscillation signal based on a control voltage. The frequency difference detector detects a frequency difference between a reference signal and the oscillation signal. The frequency difference detector outputs a first control value based on the frequency difference which is detected. The phase difference detector detects a phase difference between the reference signal and the oscillation signal. The phase difference detector outputs a second control value based on the phase difference which is detected. The outputter outputs the control voltage based on the first control value and the second control value to the voltage control oscillator while the second control value does not exceed a predetermined range. The outputter outputs the control voltage based on a corrected value obtained by correcting the first control value and the second control value to the voltage control oscillator while the second control value exceeds a predetermined range.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

[Configuration of PLL Circuit 1]

Figure 1:
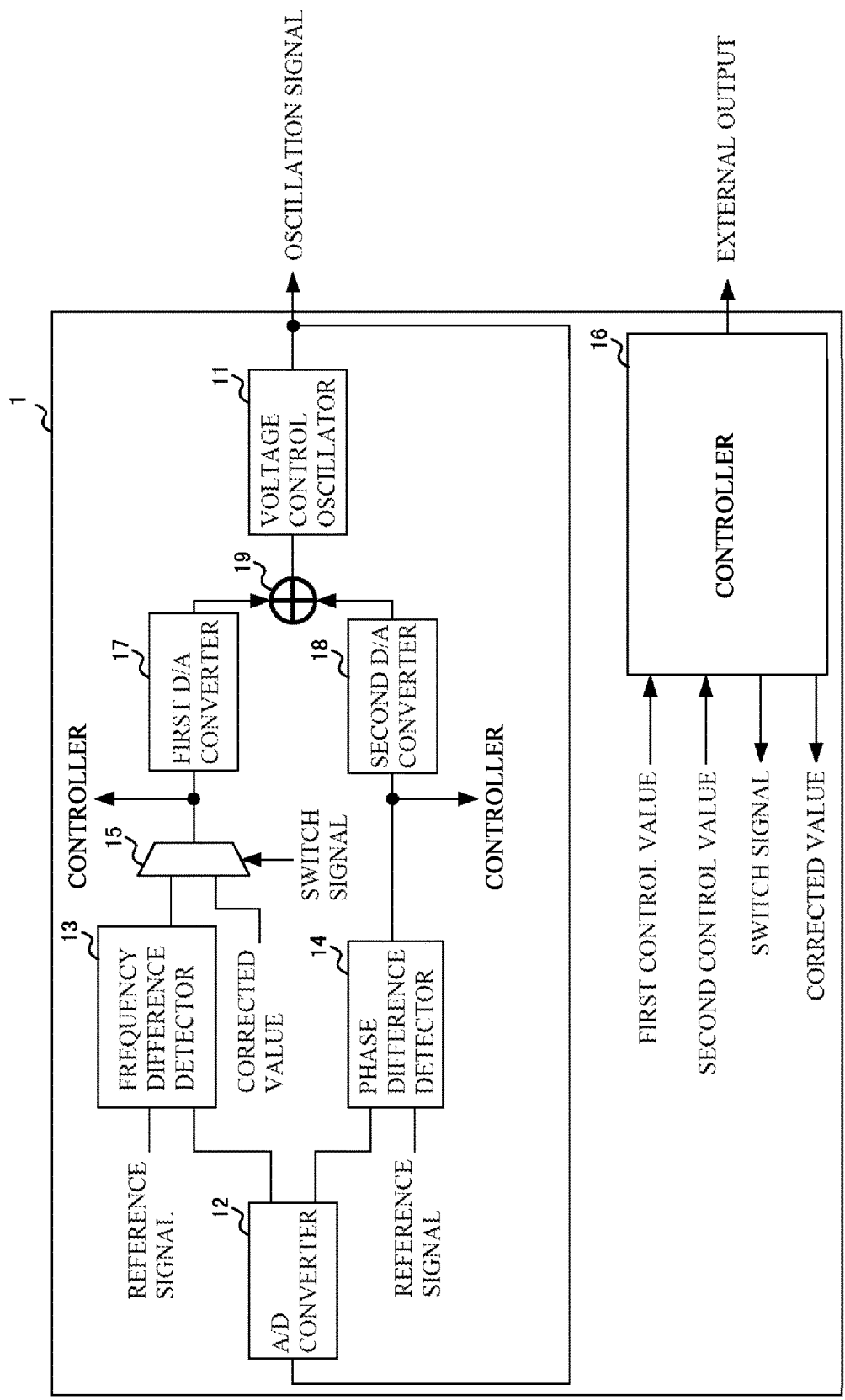
FIG. 1 is a drawing illustrating a configuration of a PLL circuit according to an embodiment.

FIG. 1 is a drawing illustrating a configuration of a PLL circuit 1 according to an embodiment. The PLL circuit 1 includes a voltage control oscillator 11, an A/D converter 12, a frequency difference detector 13, a phase difference detector 14, a switching device 15, a controller 16, a first D/A converter 17, a second D/A converter 18, and an adder 19.

The PLL circuit 1 includes a digital circuit. The digital circuit serves as the frequency difference detector 13, the phase difference detector 14, the switching device 15, and the controller 16. The controller 16 is, for example, a Central Processing Unit (CPU).

When in a lock-up state, which is a state where the voltage control oscillator 11 outputs an oscillation signal of a predetermined frequency, the PLL circuit 1 according to the embodiment causes the voltage control oscillator 11 to operate based on a first control value output from the frequency difference detector 13 and a second control value output from the phase difference detector 14. As soon as the PLL circuit 1 transitions from the lock-up state to an unlock state where the voltage control oscillator 11 does not output the oscillation signal of the predetermined frequency, the PLL circuit 1 causes the voltage control oscillator 11 to operate based on a corrected value output by the controller 16 and the second control value output from the phase difference detector 14.

Such configuration ensures the PLL circuit 1 promptly recovering to the lock-up state even when the frequency difference detector 13 fails to operate normally to cause the unlock state, due to a factor inside the PLL circuit 1, such as temperature characteristics of the voltage control oscillator 11 and a factor outside the PLL circuit 1, such as a power source noise occurrence.

The following describes details of respective components constituting the PLL circuit 1. The voltage control oscillator 11 generates the oscillation signal of the predetermined frequency preliminarily determined based on a control voltage output by the adder 19. The voltage control oscillator 11 generates the oscillation signal of an analog signal. The voltage control oscillator 11 outputs the generated oscillation signal to an outside and also to the A/D converter 12.

The A/D converter 12 converts the oscillation signal as the analog signal output from the voltage control oscillator 11 into a digital signal. The A/D converter 12 outputs the digitalized oscillation signal to the frequency difference detector 13 and the phase difference detector 14.

The frequency difference detector 13 detects a frequency difference between a reference signal and the oscillation signal and outputs the first control value based on the detected frequency difference. Here, the reference signal is a digital signal output from a Direct Digital Synthesizer (DDS) circuit included in the digital circuit. The DDS circuit is a circuit that generates a signal of any frequency by a digital process. For example, the DDS circuit generates a reference signal of a frequency lower than that of the oscillation signal.

First, the frequency difference detector 13 detects the frequency difference between the reference signal and the oscillation signal. The frequency difference detector 13, for example, detects the frequency difference between a signal obtained by frequency dividing the input oscillation signal and the reference signal. Subsequently, the frequency difference detector 13, for example, refers to a table that is stored in a storage area disposed in the digital circuit and associates the frequency differences with the first control values so as to specify the first control value associated with the detected frequency difference. The frequency difference detector 13 may specify the first control value corresponding to data after the detected frequency difference being filtered by a low-pass filter. The frequency difference detector 13 outputs the specified first control value to the switching device 15.

The frequency difference detector 13 is configured to coarsely adjust the frequency of the oscillation signal output by the voltage control oscillator 11 within, for example, a range of 120 MHz by outputting the first control value based on the frequency difference. However, the frequency of the oscillation signal output by the voltage control oscillator 11 based on the control voltage corresponding to the first control value has a deviation of approximately 300 KHz at most compared with the predetermined frequency. Therefore, it is necessary to perform a fine adjustment using the phase difference detector 14 as well as the coarse adjustment by the frequency difference detector 13.

The phase difference detector 14 detects the phase difference between the reference signal and the oscillation signal, and outputs the second control value based on the detected phase difference. The phase difference detector 14 detects, for example, the phase difference between a signal obtained by frequency dividing the input oscillation signal and the reference signal. The phase difference detector 14, for example, refers to a table that is stored in the storage area disposed in the digital circuit and associates the phase differences with the second control values so as to specify the second control value associated with the detected phase difference. The phase difference detector 14 may specify the second control value corresponding to data after the detected phase difference being filtered by the low-pass filter. The phase difference detector 14 outputs the specified second control value to the second D/A converter 18 and the controller 16.

The phase difference detector 14 is configured to finely adjust the frequency of the oscillation signal output by the voltage control oscillator 11 within, for example, a range of 300 KHz by outputting the second control value based on the phase difference signal. Accordingly, the phase difference detector 14 performs the fine adjustment of the frequency of the oscillation signal coarsely adjusted by the frequency difference detector 13, thereby ensuring adjusting the frequency of the oscillation signal to the predetermined frequency.

The switching device 15, the controller 16, the first D/A converter 17, the second D/A converter 18, and the adder 19 operate as an outputter that outputs the control voltage based on the first control value and the second control value to the voltage control oscillator 11 while the second control value does not exceed a predetermined range, and outputs the control voltage based on the corrected value obtained by correcting the first control value and the second control value to the voltage control oscillator 11 while the second control value exceeds the predetermined range.

The switching device 15 outputs the first control value while the second control value output by the phase difference detector 14 does not exceed the predetermined range and outputs the corrected value obtained by correcting the first control value while the second control value exceeds the predetermined range by a control of the controller 16. The switching device 15 is a selector that switches, for example, whether outputting the first control value based on a switch signal output from the controller 16 or outputting the corrected value obtained by correcting the first control value.

When a predetermined time elapses after the PLL circuit 1 starts operating, the controller 16 determines whether the PLL circuit 1 has transitioned from the lock-up state to the unlock state or not based on the second control value output from the phase difference detector 14. The controller 16 calculates the corrected value obtained by correcting the first control value output from the frequency difference detector 13 in response to the state of the PLL circuit 1 has transitioned to the unlock state. Here, the predetermined time is, for example, a time longer than the time it takes from the PLL circuit 1 starts the operation until the PLL circuit 1 transitions to the lock-up state.

The controller 16 calculates the corrected value by adding a predetermined value to the first control value as soon as the second control value exceeds an upper limit value indicating the upper limit of the predetermined range preliminarily determined. The controller 16 calculates the corrected value by subtracting a predetermined value from the first control value as soon as the second control value falls below a lower limit value preliminarily determined.

The controller 16 outputs the switch signal that causes the switching device 15 to output the first control value while the second control value does not exceed the predetermined range preliminarily determined. The controller 16 outputs the switch signal that causes the switching device 15 to output the corrected value as soon as the second control value exceeds the predetermined range.

The controller 16 outputs a signal that indicates that the PLL circuit 1 has transitioned to the unlock state as soon as the state of the PLL circuit 1 transitions to the unlock state. This ensures informing, for example, an administrator of the PLL circuit 1 that the PLL circuit 1 has transitioned to the unlock state.

The first D/A converter 17 serves as a second converter and converts the first control value or the corrected value output by the switching device 15 into an analog signal. The first D/A converter 17 outputs the first control value or the corrected value converted into the analog signal to the adder 19.

The second D/A converter 18 serves as a third converter and converts the second control value output by the phase difference detector 14 into an analog signal. The second D/A converter 18 outputs the second control value converted into the analog signal to the adder 19.

The adder 19 outputs the control voltage based on the first control value or the corrected value output by the switching device 15 and the second control value output by the phase difference detector 14 to the voltage control oscillator 11. Specifically, the adder 19 generates the control voltage by combining the analog signal indicating the first control value or the corrected value output by the first D/A converter 17 and the analog signal indicating the second control value output by the second D/A converter 18. The adder 19 outputs the generated control voltage to the voltage control oscillator 11. This ensures the voltage control oscillator 11 outputting the oscillation signal of the predetermined frequency based on the corrected value generated by the controller 16 and the second control value output by the phase difference detector 14 even when the frequency difference detector 13 fails to operate normally.

[Procedure of Process in Controller 16]

Figure 2:
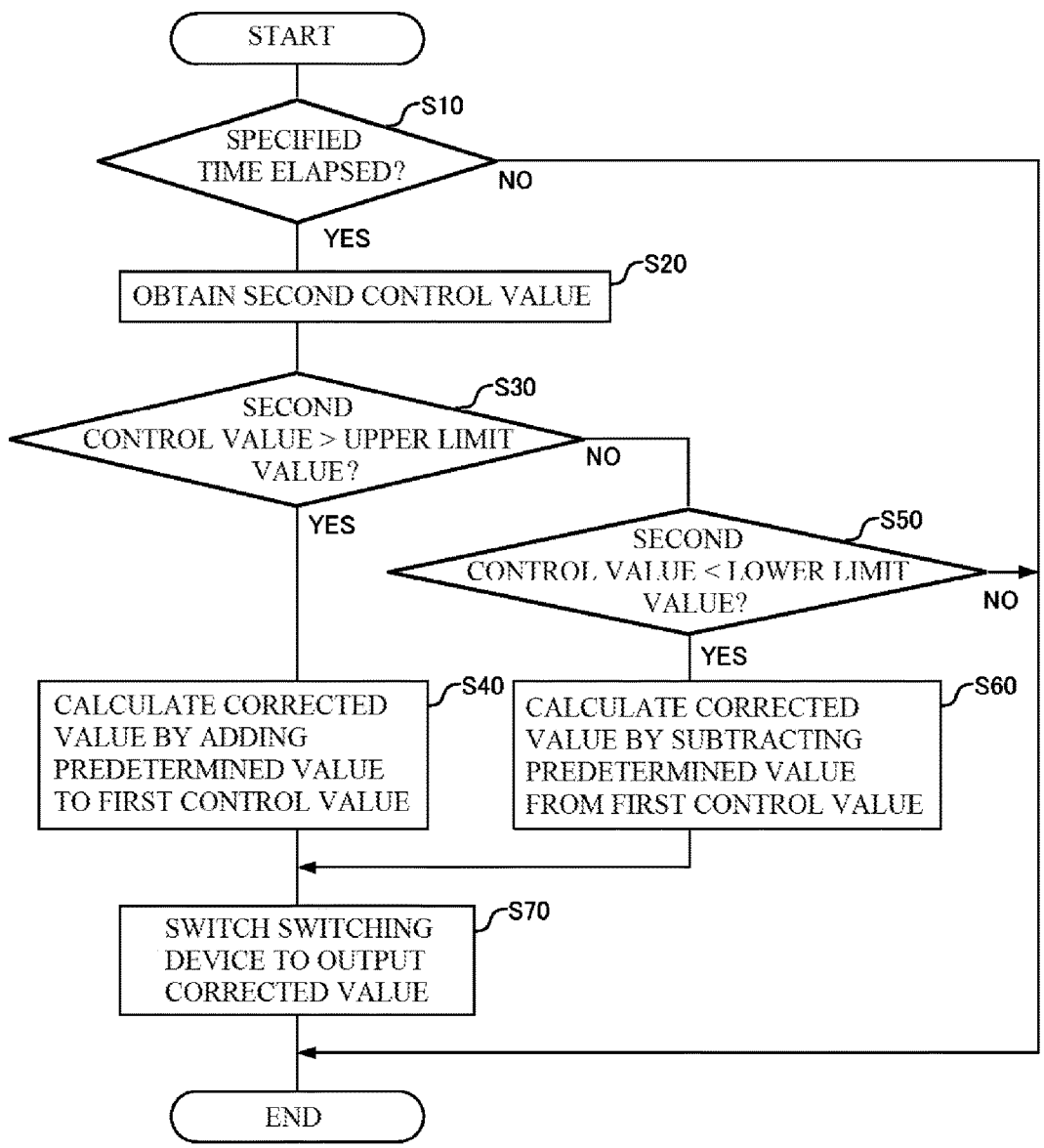
FIG. 2 is a flowchart illustrating a procedure of a process in a controller according to the embodiment.

Subsequently, a procedure of a process in the controller 16 will be described. FIG. 2 is a flowchart illustrating the procedure of the process in the controller 16 according to the embodiment. It should be noted that, at the start of the embodiment, it is assumed that the controller 16 outputs the switch signal for causing the switching device 15 to output the first control value, which is output by the frequency difference detector 13, to the switching device 15.

First, the controller 16 determines whether a specified time has elapsed or not from the PLL circuit 1 started the operation (Step S10). The controller 16 advances the process to Step S20 when it is determined that the specified time has elapsed from the start of operation. The controller 16 terminates the process according to this flowchart when the specified time has not elapsed from the start of operation.

Subsequently, the controller 16 obtains the second control value output by the phase difference detector 14 (Step S20).

Subsequently, the controller 16 determines whether the second control value is greater than the upper limit value indicating the upper limit of the predetermined range or not (Step S30). The controller 16 advances the process to Step S40 when it is determined that the second control value is greater than the upper limit value. At Step S40, the controller 16 obtains the first control value and adds the predetermined value to this first control value to calculate the corrected value. The controller 16 advances the process to Step S50 when it is determined that the second control value is equal to or less than the upper limit value.

At Step S50, the controller 16 determines whether the second control value is smaller than the lower limit value indicating the lower limit of the predetermined range or not. The controller 16 advances the process to Step S60 when it is determined that the second control value is smaller than the lower limit value. The controller 16 terminates the process according to this flowchart when it is determined that the second control value is equal to or more than the lower limit value.

At Step S60, the controller 16 obtains the first control value and calculates the corrected value by subtracting the predetermined value from this first control value. At Step S70, the controller 16 outputs the switch signal, which causes the output of the corrected value calculated by the controller 16 itself, to the switching device 15 to switch the switching device 15 to output the corrected value.

It should be noted that the controller 16 may be configured to execute the process according to the flowchart illustrated in FIG. 2 for multiple times. In this case, the controller 16 may be configured to gradually reduce a value of the predetermined value used for calculating the corrected value corresponding to a count of execution of the process according to the flowchart. Such configuration ensures the controller 16 converging the frequency of the oscillation signal output from the voltage control oscillator 11 to the predetermined frequency.

[Effect of Embodiment]

As described above, the PLL circuit 1 according to the embodiment outputs the control voltage based on the first control value and the second control value output by the frequency difference detector 13 to the voltage control oscillator 11 while the second control value output by the phase difference detector 14 does not exceed the predetermined range and outputs the control voltage based on the corrected value obtained by correcting the first control value and the second control value to the voltage control oscillator 11 while the second control value exceeds the predetermined range.

Even when the PLL circuit 1 transitions to the unlock state due to the factor inside the PLL circuit 1, such as the temperature characteristics of the voltage control oscillator 11 and the factor outside the PLL circuit 1, such as the power source noise occurrence, thus configured PLL circuit 1 ensures a prompt transition to the lock-up state without removing these factors.

While the disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure.

The outputter may include a controller, a switching device, and an adder. The controller calculates a corrected value obtained by correcting the first control value. The switching device outputs the first control value while the second control value does not exceed a predetermined range. The switching device outputs the corrected value while the second control value exceeds the predetermined range. The adder outputs the control voltage based on the first control value or the corrected value output by the switching device and the second control value output by the phase difference detector to the voltage control oscillator.

The controller may calculate the corrected value while the second control value exceeds an upper limit value indicating an upper limit of the predetermined range by adding a predetermined value to the first control value. The controller may calculate the corrected value while the second control value falls below a lower limit value indicating a lower limit of the predetermined range by subtracting the predetermined value from the first control value.

The controller may calculate the corrected value after a predetermined time elapses from the PLL circuit starts an operation.

The PLL circuit may further include a first converter, a second converter, a third converter, and a digital circuit. The first converter converts the oscillation signal into a digital signal. The second converter converts the first control value or the corrected value into a first control voltage. The third converter converts the second control value into a second control voltage. The digital circuit includes the frequency difference detector, the phase difference detector, the controller, and the switching device.

With the embodiment, it is provided an effect that ensures the PLL circuit transitioning from the unlock state to the lock-up state in a short time.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A PLL circuit, comprising:
   a voltage control oscillator that outputs an oscillation signal based on a control voltage;
   a frequency difference detector that detects a frequency difference between a reference signal and the oscillation signal, the frequency difference detector outputting a first control value based on the frequency difference which is detected;
   a phase difference detector that detects a phase difference between the reference signal and the oscillation signal, the phase difference detector outputting a second control value based on the phase difference which is detected; and
   an outputter that outputs the control voltage, based on the first control value and the second control value, to the voltage control oscillator while the second control value does not exceed a predetermined range, the outputter outputting the control voltage, based on a corrected value obtained by correcting the first control value and the second control value, to the voltage control oscillator while the second control value exceeds a predetermined range.

2. The PLL circuit according to claim 1, wherein the outputter comprising:
   a controller that calculates the corrected value obtained by correcting the first control value;
   a switching device that outputs the first control value while the second control value does not exceed the predetermined range, the switching device outputting the corrected value while the second control value exceeds the predetermined range; and
   an adder that outputs the control voltage based on the first control value or the corrected value output by the switching device and the second control value output by the phase difference detector to the voltage control oscillator.

3. The PLL circuit according to claim 2, wherein
   the controller calculates the corrected value while the second control value exceeds an upper limit value indicating an upper limit of the predetermined range by adding a predetermined value to the first control value,
   the controller calculates the corrected value while the second control value falls below a lower limit value indicating a lower limit of the predetermined range by subtracting the predetermined value from the first control value.

4. The PLL circuit according to claim 2, wherein
   the controller calculates the corrected value after a predetermined time elapses from the moment the PLL circuit starts an operation.

5. The PLL circuit according to claim 2, further comprising:
   a first converter that converts the oscillation signal into a digital signal;
   a second converter that converts the first control value or the corrected value into a first control voltage;
   a third converter that converts the second control value into a second control voltage; and
   a digital circuit that includes the frequency difference detector, the phase difference detector, the controller, and the switching device.

* * * * *